US012598991B2

(12) United States Patent
Chen et al.

(10) Patent No.: US 12,598,991 B2
(45) Date of Patent: Apr. 7, 2026

(54) LIQUID CIRCULATING COOLING PACKAGE SUBSTRATE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Juchen Huang, Guangdong (CN); Xiaowei Xu, Guangdong (CN); Benxia Huang, Guangdong (CN); Gao Huang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 456 days.

(21) Appl. No.: 18/196,012

(22) Filed: May 11, 2023

(65) Prior Publication Data

US 2023/0369167 A1     Nov. 16, 2023

(30) Foreign Application Priority Data

May 13, 2022     (CN) .......................... 202210526848.2

(51) Int. Cl.
*H01L 23/498*          (2006.01)
*G11C 5/06*          (2006.01)
          (Continued)

(52) U.S. Cl.
CPC .......... *H10W 40/47* (2026.01); *H05K 1/0272* (2013.01); *H05K 1/186* (2013.01);
          (Continued)

(58) Field of Classification Search
CPC ............... H01L 21/4882; H01L 23/367; H01L 23/3675; H01L 23/473; H01L 23/46;
          (Continued)

(56) References Cited

U.S. PATENT DOCUMENTS 10,332,832 B2 *  6/2019  Kapusta ............ H01L 23/49541
2020/0273777 A1 *  8/2020  Jain ........................ H01L 21/565
          (Continued)

FOREIGN PATENT DOCUMENTS

CN          113675158 A  * 11/2021  ............. H01L 23/46

*Primary Examiner* — Wael M Fahmy
*Assistant Examiner* — Aneesa Riaz Baig
(74) *Attorney, Agent, or Firm* — The PL Law Group, PLLC

(57)          ABSTRACT

A liquid circulating cooling package substrate includes a circulating cooling structure including a cooling chamber in a first dielectric layer to expose a heat dissipation face, a metal heat dissipation layer on the inner surface of the cooling chamber, an upright support column formed on a metal heat dissipation layer, and a cooling cover supported on the support column to close the cooling chamber along the periphery of the cooling chamber. The metal heat dissipation layer completely covers the heat dissipation face and the inner side surface of the cooling chamber, and a liquid inlet and a liquid outlet are formed on the cooling cover. A circulating cooling structure is provided in the first dielectric layer, and the circulating cooling structure is formed during the processing of an embedded package substrate such that the processing flow is simple and the cost is low.

8 Claims, 4 Drawing Sheets

(51) Int. Cl.

| | |
|---|---|
| *H01L 21/768* | (2006.01) |
| *H01L 23/00* | (2006.01) |
| *H01L 23/495* | (2006.01) |
| *H05K 1/02* | (2006.01) |
| *H05K 1/185* | (2026.01) |
| *H10B 51/10* | (2023.01) |
| *H10B 51/20* | (2023.01) |
| *H10D 30/01* | (2025.01) |
| *H10D 30/47* | (2025.01) |
| *H10D 62/85* | (2025.01) |
| *H10D 64/64* | (2025.01) |
| *H10H 20/852* | (2025.01) |
| *H10H 20/857* | (2025.01) |
| *H10W 40/47* | (2026.01) |
| *H10W 70/05* | (2026.01) |
| *H10W 70/60* | (2026.01) |
| *H10W 70/63* | (2026.01) |
| *H10W 74/10* | (2026.01) |
| *H10W 90/00* | (2026.01) |

(52) U.S. Cl.
CPC . *H10W 74/114* (2026.01); *H05K 2201/10015* (2013.01); *H05K 2201/10022* (2013.01); *H05K 2201/1003* (2013.01); *H10W 70/093* (2026.01); *H10W 70/60* (2026.01); *H10W 70/635* (2026.01); *H10W 90/00* (2026.01)

(58) Field of Classification Search
CPC ......... H01L 23/49838; H01L 23/49822; H01L 23/49866; H01L 23/5389; H01L 23/49827; H01L 21/4853; H01L 21/4857; H01L 21/486; H10W 40/47; H10W 74/114; H10W 74/01; H10W 70/68; H10W 70/685; H05K 1/0272
See application file for complete search history.

(56) References Cited

U.S. PATENT DOCUMENTS

2023/0010115 A1* 1/2023 Chen .................... H01L 21/4857
2023/0369167 A1* 11/2023 Chen ....................... H01L 24/24

\* cited by examiner

LIQUID CIRCULATING COOLING PACKAGE SUBSTRATE AND MANUFACTURING METHOD THEREOF

CROSS REFERENCE TO RELATED APPLICATIONS AND CLAIM OF PRIORITY

This application claims the benefit under 35 USC § 119 of Chinese Patent Application No. 2022105268482 filed on May 13, 2022 in the Chinese Intellectual Property Office, the entire disclosure of which is incorporated herein by reference for all purposes.

BACKGROUND

1. Technical Field

The present application relates to the technical field of semiconductor packaging, and more particularly to a liquid circulating cooling package substrate and a manufacturing method thereof.

2. Background Art

With the development and progress of electronic technology, electronic products evolve in the direction of being short, small, light, and thin, and electronic products are required to have more and more powerful functions, which promotes the packaging structure of electronic products to develop in the direction of high integration and miniaturization. Therefore, embedded packaging of components and parts such as chips emerges as the times require. At the same time, the application of electronic elements is moving towards high-frequency, high-speed and high-power, resulting in a rapid progressive increase of heat flux density per unit area. It is well known that as the temperature of the operating environment increases, the operating speed of electronic elements decreases accordingly, and the loss thus increases accordingly: at the same time, the reliability of electronic products decreases relatively when electronic products operate in a high-temperature environment for a long time. Therefore, if the heat generated by a high-frequency, high-speed, and high-power electronic element cannot be dissipated in time, the performance and reliability of an electronic product may be affected to some extent. Therefore, under the trend of high-frequency, high-speed, and high-power, how to rationally optimize the design of embedded package substrate and package body and improve the heat dissipation performance of embedded packaging structure is an important matter at present.

At present, two embedded package substrate modes commonly used are as follows: (1) a chip and like components and parts are attached to a polymer frame or core material of a preset cavity, and then packaging is performed by using plastic packaging materials: however, this mode has the disadvantage that with the rise of high-frequency, high-speed, and high-power products, embedded packaging products have very high heat dissipation requirements: even for organic polymer materials with very good heat dissipation performance, the heat dissipation characteristics have limitations, which can not fundamentally solve the heat dissipation problem of high-frequency, high-speed, and high-power embedded products: (2) a metal frame is used for embed components and parts, a cavity is pre-processed on a metal (e.g. copper) plate, components and parts such as chips are attached to the preset cavity, and then packaging is performed by pressing fit the dielectric material: this embedded packaging mode takes advantage of the relatively good heat dissipation performance of a metal, replaces the organic polymer material frame, and improves the heat dissipation performance of a embedded packaging structure: however, the solution of attaching components and parts such as chips to a metal frame and then performing packaging with a plastic packaging material has disadvantages as follows: the process flow is complex and costly, and the metal frame is coated with a dielectric material so that the heat dissipation rate is still slow:

SUMMARY

In view of the above, the purpose of the present application is to propose a liquid circulating cooling package substrate and a manufacturing method thereof to solve the above problems.

Based on the above-mentioned object, the first aspect of the present application provides a liquid circulating cooling package substrate, including:

a device that has an active face and a heat dissipation face and that is embedded in at least one through cavity surrounded by a support frame, the support frame including a conducting column penetrating through the support frame in a height direction;

a first dielectric layer on the first surface of the support frame and a second dielectric layer on the second surface of the support frame, wherein the first dielectric layer completely fills a gap between the device and the support frame;

a circulating cooling structure, including a cooling chamber formed in the first dielectric layer to expose the heat dissipation face, a metal heat dissipation layer formed on the inner surface of the cooling chamber, an upright support column formed on the metal heat dissipation layer, and a cooling cover supported on the support column to close the cooling chamber along a periphery of the cooling chamber, wherein the metal heat dissipation layer completely covers the heat dissipation face and an inner side surface of the cooling chamber, and a liquid inlet and a liquid outlet are formed on the cooling cover; and a first wiring layer formed on the first dielectric layer and a second wiring layer formed on the second dielectric layer, wherein the second wiring layer is electrically connected to a terminal on the active face of the device, and the first wiring layer and the second wiring layer are electrically connected through the conducting column.

In some embodiments, the cooling cover connects the support column and a periphery of the metal heat dissipation layer by solder or corrosion-resistant glue, thereby closing the cooling chamber.

In some embodiments, the liquid inlet and the liquid outlet are provided on two sides of the support column.

In some embodiments, the metal heat dissipation layer includes a copper layer.

In some embodiments, a solder mask provided on the outer surfaces of the first wiring layer and the second wiring layer is further included.

Based on the same inventive concept, the second aspect of the present application provides a manufacturing method for a liquid circulating cooling package substrate, including:

(a) prefabricating a support frame, the support frame including a conducting column penetrating through the support frame in a height direction and at least one through cavity surrounded by the support frame;

(b) mounting a device having an active face and a heat dissipation face in the through cavity, and applying a first dielectric layer on the first surface of the support frame such that the first dielectric layer completely fills a gap between the device and the support frame;

(c) opening a hole in the first dielectric layer to form a first pattern, the first pattern including a cooling chamber exposing the heat dissipation face of the device, and filling the first pattern to form a first wiring layer and a metal heat dissipation layer on the heat dissipation face, wherein the metal heat dissipation layer completely covers the heat dissipation face and an inner side surface of the cooling chamber;

(d) applying a second dielectric layer to a second surface of the support frame, opening a hole in the second dielectric layer to form a second pattern, the second pattern exposing a terminal on the active face of the device, and filling the second pattern to form a second wiring layer, wherein the first wiring layer and the second wiring layer are electrically connected via the conducting column; and (e) forming a support column on the metal heat dissipation layer on the heat dissipation face of the device, and applying a cooling cover on the support column, the cooling cover closing the cooling chamber along a periphery of the cooling chamber, wherein the cooling cover is formed with a liquid inlet and a liquid outlet.

In some embodiments, step (b) includes:

(b1) applying a temporary carrier on the second surface of the support frame;

(b2) placing the device in the through cavity such that the active face of the device is attached to the temporary carrier;

(b3) forming the first dielectric layer on the first surface of the support frame; and (b4) removing the temporary carrier.

In some embodiments, step (c) includes:

(c1) forming a first metal seed layer on the first dielectric layer;

(c2) applying a first photoresist layer on the first metal seed layer, and exposing and developing the same to form the first pattern;

(c3) performing electroplating in the first pattern to form the first wiring layer and the metal heat dissipation layer on the heat dissipation face; and (c4) removing the first photoresist layer and the first metal seed layer.

In some embodiments, in step (c), the metal heat dissipation layer includes a copper layer.

In some embodiments, step (d) includes:

(d1) forming a second metal seed layer on the second dielectric layer;

(d2) applying a second photoresist layer on the second metal seed layer, and exposing and developing the same to form the second pattern;

(d3) performing electroplating in the second pattern to form the second wiring layer; and (d4) removing the second photoresist layer and the second metal seed layer.

In some embodiments, step (e) includes:

(e1) filling the cooling chamber with a dielectric material to form a third dielectric layer;

(e2) forming an opening by laser in the third dielectric layer to form a third pattern exposing the metal heat dissipation layer;

(e3) electroplating to fill the third pattern to form the support column; and (e4) removing the third dielectric layer.

In some embodiments, step (e) further includes:

(e1') filling a photoresist material in the cooling chamber to form a third photoresist layer;

(e2') exposing and developing the third photoresist layer to form a third pattern exposing the metal heat dissipation layer;

(e3') electroplating to fill the third pattern to form the support column; and (e4') removing the third photoresist layer.

In some embodiments, in step (e), the cooling cover connects the support column and a periphery of the metal heat dissipation layer by solder or corrosion-resistant glue, thereby closing the cooling chamber.

In some embodiments, the following is also included:

(f) after step (e), applying a solder resist material on the first wiring layer and the second wiring layer, respectively, to form a solder mask.

It can be seen from the above that the present application provides a liquid circulating cooling package substrate and a manufacturing method thereof. A circulating cooling structure is directly provided on the heat dissipation face of a device in the first dielectric layer, and the circulating cooling structure is formed during the processing of an embedded package substrate, with a simple processing flow and low cost: the circulating cooling structure can be connected with an external liquid cooling system such that the external cooling liquid can enter the circulating cooling structure from the liquid inlet, and after passing through the cooling cavity, can finally flow out from the liquid outlet of the circulating cooling structure: the cooling liquid can quickly take away the heat generated during the operation of the device, greatly improving the heat dissipation performance of the embedded packaging structure. In addition, the circulating cooling structure is connected to the heat dissipation face of the device, so that the heat dissipation performance can be improved, and the space in the substrate can be rationally used to reduce the overall thickness of the substrate. The support column provided in the circulating cooling structure also enables the cooling liquid entering the circulating cooling structure to be disturbed to form a turbulent flow; further improving the heat dissipation efficiency of the device.

BRIEF DESCRIPTION OF THE DRAWINGS

In order to illustrate the technical solutions of the present application or in the related art more clearly, the following will briefly introduce the drawings that need to be used in the description of the embodiments or the related art. Obviously, the drawings in the following description are merely embodiments of the present application. For those of ordinary skills in the art, other drawings can be obtained according to these drawings without involving inventive efforts.

Figure 1:
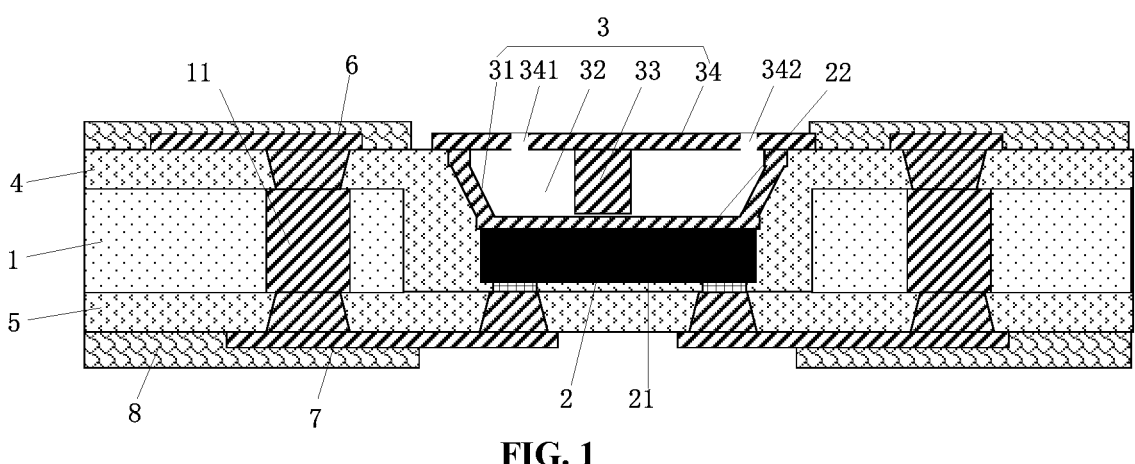
FIG. 1 is a schematic cross-sectional diagram of a liquid circulating cooling package substrate according to one embodiment of the present invention.

In the drawings, 1—support frame: 11—conducting column: 12—through cavity: 2—device: 21—active face: 22—heat dissipation face: 3—circulating cooling structure: 31 metal heat dissipation layer: 32—cooling chamber: 33—support column: 34—cooling cover: 341—liquid inlet: 342—liquid outlet: 5—second dielectric layer: 6—first wiring layer: 7—second wiring layer: 8—solder mask: 9—temporary carrier.

DETAILED DESCRIPTION OF THE EMBODIMENTS

In order to make the purpose, technical solution, and advantages of the present application clearer, the present application will be further described in detail below in conjunction with specific embodiments and with reference to the accompanying drawings.

It needs to be noted that, unless otherwise defined, technical or scientific terms used in the embodiments of the present application shall have the general meaning as understood by one of ordinary skills in the art to which the present application belongs. The "first", "second", and similar words used in the embodiments of the present application do not denote any order, quantity, or importance, but are only used to distinguish different constituent parts. Similar words such as "including" or "containing" mean that the element or object appearing before the word covers the element or object listed appearing after the word and its equivalents, without excluding other elements or objects. Similar terms such as "connection" or "connected" are not limited to physical or mechanical connections, but can include electrical connections, whether direct or indirect. "Up", "down", "left", "right", etc. are only used to represent the relative position relationship. When the absolute position of the described object changes, the relative position relationship may also change accordingly.

Referring to FIG. 1, the present application provides a liquid circulating cooling package substrate, including:

a device 2 that has an active face 21 and a heat dissipation face 22 and that is embedded in at least one through cavity 12 surrounded by a support frame 1, the support frame 1 including a conducting column 11 penetrating through the support frame 1 in a height direction;

a first dielectric layer on the first surface of the support frame 1 and a second dielectric layer 5 on the second surface of the support frame 1, wherein the first dielectric layer completely fills the gap between the device 2 and the support frame 1;

a circulating cooling structure 3, including a cooling chamber 32 formed in the first dielectric layer to expose the heat dissipation face 22, a metal heat dissipation layer 31 formed on the inner surface of the cooling chamber 32, an upright support column 33 formed on the metal heat dissipation layer 31, and a cooling cover 34 supported on the support column 33 to close the cooling chamber 32 along the periphery of the cooling chamber 32, wherein the metal heat dissipation layer 31 completely covers the heat dissipation face 22 and the inner side surface of the cooling chamber 32, and a liquid inlet 341 and a liquid outlet 342 are formed on the cooling cover 34; and a first wiring layer 6 formed on the first dielectric layer and a second wiring layer 7 formed on the second dielectric layer 5, wherein the second wiring layer 7 is electrically connected to a terminal on the active face 21 of the device 2, and the first wiring layer 6 and the second wiring layer 7 are electrically connected through the conducting column 11.

Specifically, the support frame I may be made of a polymer material, which may be polyimide, epoxy resin, bismaleimide, triazine resin, glass fiber reinforced resin, or a combination thereof. It is worth understanding that the number of through cavities 12 may be one or more, and for ease of description, the present embodiment is illustrated with one through cavity 12 as an example. The conducting column 11 may include at least one conducting copper column as an IO channel, and the cross-sectional dimensions thereof may be the same or different: the shape of the conducting column 11 can be set according to practical requirements, for example, it can be square, circular, etc. without being specifically limited.

The device 2 can be a bare chip, such as a driver chip (IC driver) of an integrated circuit, a field effect transistor (FET), etc., and can also be a passive device 2, such as a capacitor, a resistor or an inductor, etc., and can also be a single package body after preliminary packaging, such as a ball grid array (BGA)/grid array (LGA), etc. or a combination of various devices 2 therein: the device 2 may be a device 2 with a terminal on a single face or a device 2 with terminals on both faces. In the present embodiment, the device 2 is exemplified as a chip having a single-faced terminal, but it is not limited to performing subsequent operations only on a chip having a single-faced terminal.

The first dielectric layer and the second dielectric layer 5 may be made of at least one material selected from an epoxy resin, a phenol resin, a benzocyclobutene resin, a polyesterimine resin, ABF, etc.

The circulating cooling structure 3 is located in the first dielectric layer and is connected to the heat dissipation face 22 of the device 2, which can not only improve the heat dissipation performance, but also rationally use the space in the substrate to reduce the overall thickness of the substrate. The metal heat dissipation layer 31 can protect the device 2 from moisture, and can also use its own metal material to perform auxiliary heat dissipation so as to improve the heat dissipation performance of the substrate. The metal heat dissipation layer 31 includes a copper layer, and the heat dissipation performance of the substrate is further improved by using the good thermal conductivity of the metal copper.

The support column 33 is located on the metal heat dissipation layer 31 corresponding to the heat dissipation face 22. One end of the support column 33 is connected to the cooling cover 34, and the other end is connected to the heat dissipation face 22 of the device 2. The support column 33 may include at least one conducting copper column as an IO channel.

Figure 2:
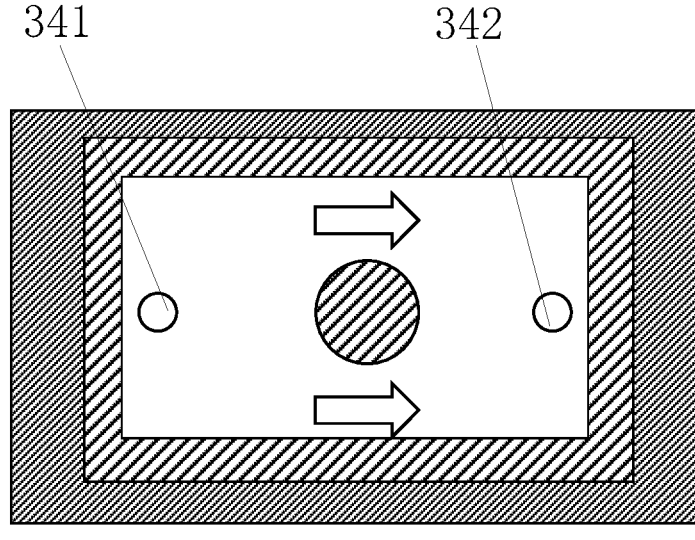
FIG. 2 is a schematic cross-sectional diagram of a circulating cooling structure according to one embodiment of the present invention.

Referring to FIG. 2, the cooling cover 34 connects the support column 33 and the periphery of the metal heat dissipation layer 31 by solder or corrosion-resistant glue, thereby closing the cooling chamber 32. A liquid inlet 341 and a liquid outlet 342 are formed on the cooling cover 34, and the liquid inlet 341 and the liquid outlet 342 are provided on two sides of the support column 33. The liquid inlet 341 is used for connecting with an external liquid inlet system, and the liquid outlet 342 is used for connecting with an external liquid outlet system, so that the circulating cooling structure 3 can be connected with the external liquid inlet system and the external liquid outlet system. Therefore, the external cooling liquid can enter the circulating cooling structure 3 from the liquid inlet 341, and after passing through the cooling chamber 32, can finally flow out from the liquid outlet 342 of the circulating cooling structure 3. The cooling liquid can quickly take away the heat generated during the operation of the device 2, greatly improving the heat dissipation performance of the embedded packaging structure. In addition, the circulating cooling structure 3 is connected to the heat dissipation face 22 of the device 2, so that the heat dissipation performance can be improved, and the space in the substrate can be rationally used to reduce the overall thickness of the substrate.

In some embodiments, the substrate further includes a solder mask 8 provided on the outer surfaces of the first wiring layer 6 and the second wiring layer 7. The solder mask 8 can be alternatively made of a solder resist material, and the solder resist material can be applied by means of coating, film pasting, or printing, and exposed and developed to form the solder mask 8: the exposed metal may be surface treated by immersion gold, immersion silver, gold plating, or tin plating.

Based on the same inventive concept, the second aspect of the present application provides a manufacturing method for a liquid circulating cooling package substrate, specifically including the following steps.

Figure 3:
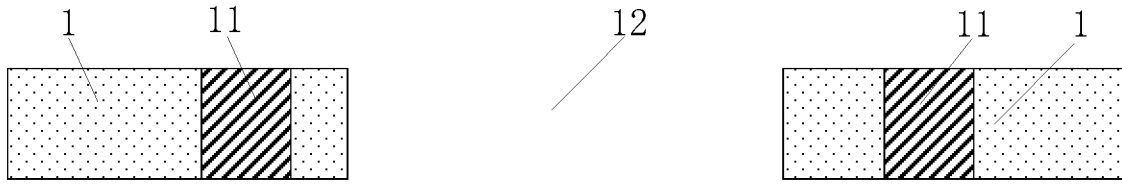
FIGS. 3 to 12 are schematic cross-sectional diagrams of an intermediate structure of each step of a manufacturing method for a liquid circulating cooling package substrate according to one embodiment of the present invention.

Step (a), with reference to FIG. 3, prefabricate a support frame 1, the support frame I including a conducting column 11 penetrating through the support frame 1 in the height direction and at least one through cavity 12 surrounded by the support frame 1.

Specifically, the number of through cavities 12 may be one or more, and for ease of description, the present embodiment is illustrated with one through cavity 12 as an example. The conducting column 11 may include at least one conducting copper column as an IO channel, and the cross-sectional dimensions thereof may be the same or different: the shape of the conducting column 11 can be set according to practical requirements, for example, it can be square, circular, etc. without being specifically limited.

Figure 4:
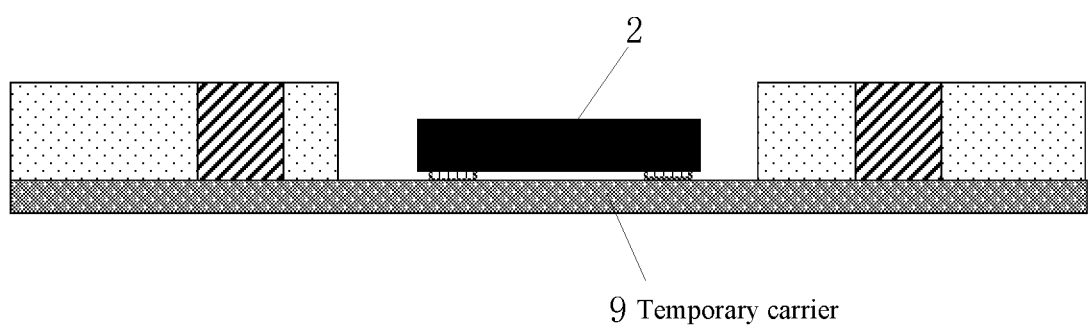

Step (b), with reference to FIG. 4, mount a device 2 having an active face 21 and a heat dissipation face 22 in the through cavity 12, and apply the first dielectric layer on the first surface of the support frame 1 such that the first dielectric layer completely fills a gap between the device 2 and the support frame 1.

Figure 5:
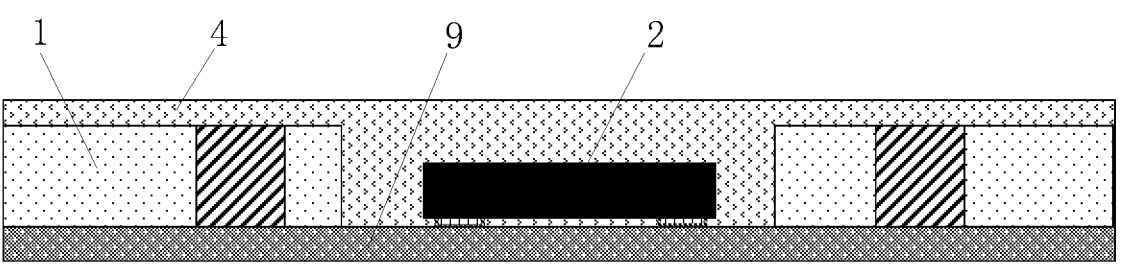
Figure 6:
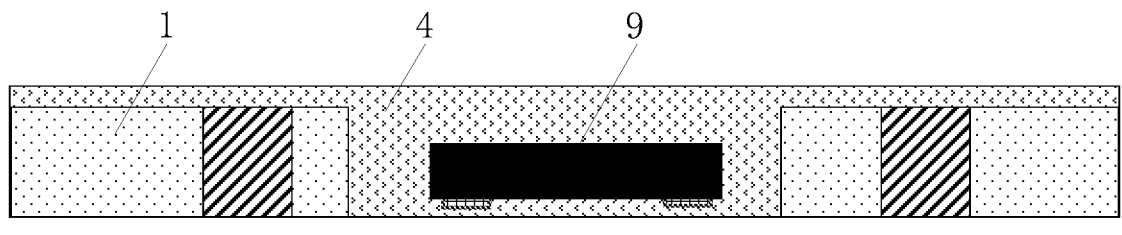

Specifically, step (b) includes the following steps:

step (b1), referring to FIG. 4, applying a temporary carrier 9 on the second surface of the support frame 1: wherein the temporary carrier 9, which may be a tape, gummed paper, rubberized fabric, or the like, achieves the purpose of providing a temporary bearing face at the bottom of the through cavity 12;

step (b2), placing the device 2 in the through cavity 12 such that the active face 21 of the device 2 is attached to the temporary carrier 9; wherein the device 2 is pasted to the temporary carrier 9, which provides stable support for the device 2;

step (b3), referring to FIG. 5, forming the first dielectric layer on the first surface of the support frame 1: wherein the first dielectric layer completely fills the gap between the device 2 and the support frame 1; and step (b4), referring to FIG. 6, removing the temporary carrier 9;

wherein, specifically, the temporary carrier 9 is removed, facilitating the subsequent application of the second dielectric layer 5 on the second surface of the support frame 1.

Figure 8:
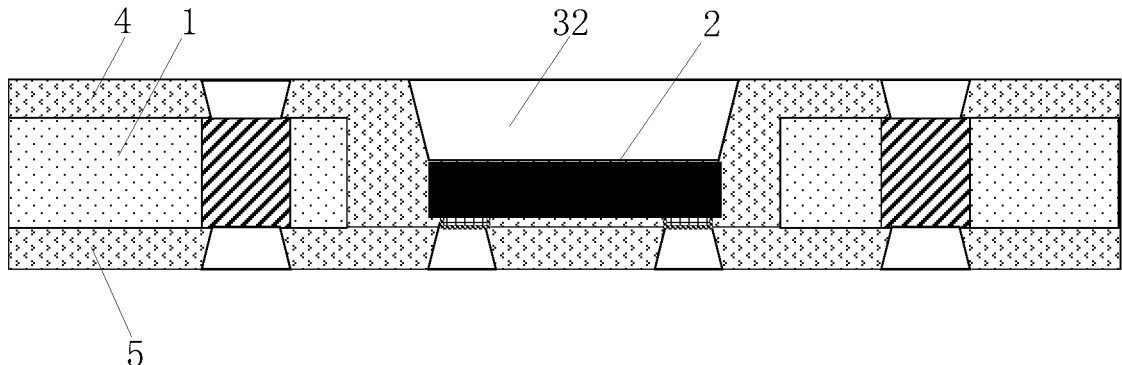
Figure 9:
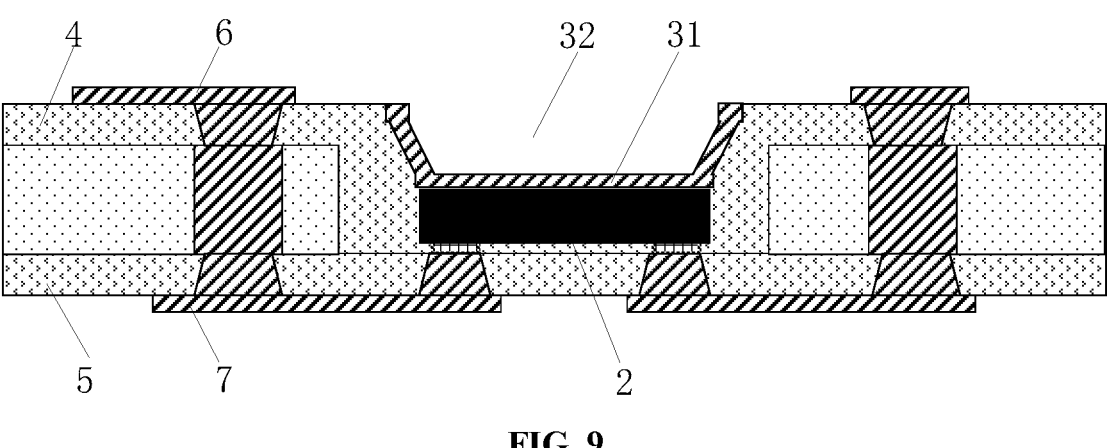

Step (c), with reference to FIGS. 8 and 9, open a hole in the first dielectric layer to form a first pattern, the first pattern including a cooling chamber 32 exposing the heat dissipation face 22 of the device 2, and fill the first pattern to form a first wiring layer 6 and a metal heat dissipation layer 31 on the heat dissipation face 22, wherein the metal heat dissipation layer 31 completely covers the heat dissipation face 22 and the inner side surface of the cooling chamber 32.

Specifically, step (c) includes the following steps:

step (c1), forming a first metal seed layer on the first dielectric layer: wherein, typically, the first metal seed layer may be formed on the first dielectric layer by means of electroless plating or sputtering, and the first metal seed layer may include titanium, copper, a titanium tungsten alloy or a combination thereof: preferably, the first metal seed layer is manufactured by sputtering titanium and copper;

step (c2), applying a first photoresist layer on the first metal seed layer, and exposing and developing the same to form the first pattern: wherein, generally, the first photoresist layer can be applied to the first metal seed layer by means of film pasting or coating: the thickness of the first photoresist layer can be adjusted as desired;

step (c3), performing electroplating in the first pattern to form the first wiring layer 6 and the metal heat dissipation layer 31 on the heat dissipation face 22: wherein the thicknesses of the first wiring layer 6 and the metal heat dissipation layer 31 on the heat dissipation face 22 can be set according to practical requirements, and are generally not higher than the thickness of the first photoresist layer: wherein the metal heat dissipation layer 31 includes a copper layer for improving the heat dissipation performance of the substrate; and step (c4), removing the first photoresist layer and the first metal seed layer: wherein, typically, the first photoresist layer may be removed by defilming and the first metal seed layer can be removed by etching.

Figure 7:
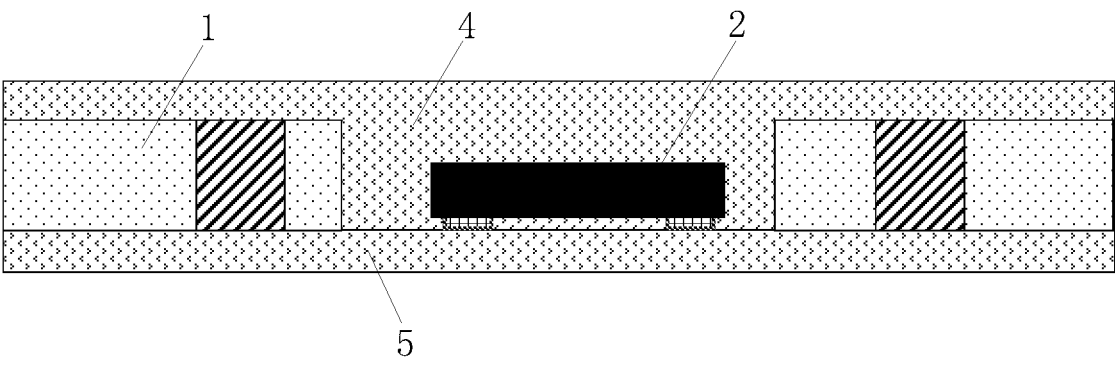

Step (d), with reference to FIGS. 7 and 8, apply a second dielectric layer 5 to a second surface of the support frame 1, open a hole in the second dielectric layer 5 to form a second pattern, the second pattern exposing a terminal on an active face 21 of the device 2, and fill the second pattern to form a second wiring layer, wherein the first wiring layer 6 and the second wiring layer 7 are electrically connected via the conducting column 11.

Specifically, step (d) includes the following steps:

step (d1), forming a second metal seed layer on the second dielectric layer 5: wherein, generally, the second metal seed layer may be formed on the second dielectric layer 5 by means of electroless plating or sputtering, and the second metal seed layer may include titanium, copper, a titanium tungsten alloy, or a combination thereof: preferably, the second metal seed layer is manufactured by sputtering titanium and copper;

step (d2), applying a second photoresist layer on the second metal seed layer, and exposing and developing the same to form the second pattern: wherein, generally, the second photoresist layer can be applied to the second metal seed layer by means of film pasting or coating: the thickness of the second photoresist layer can be adjusted as desired;

step (d3), performing electroplating in the second pattern to form the second wiring layer 7: wherein, the thickness of the second wiring layer 7 can be set according to practical requirements, and is usually no higher than the thickness of the second photoresist layer; and step (d4), removing the second photoresist layer and the second metal seed layer: wherein, typically, the first photoresist layer may be removed by defilming and the first metal seed layer can be removed by etching.

Figure 10:
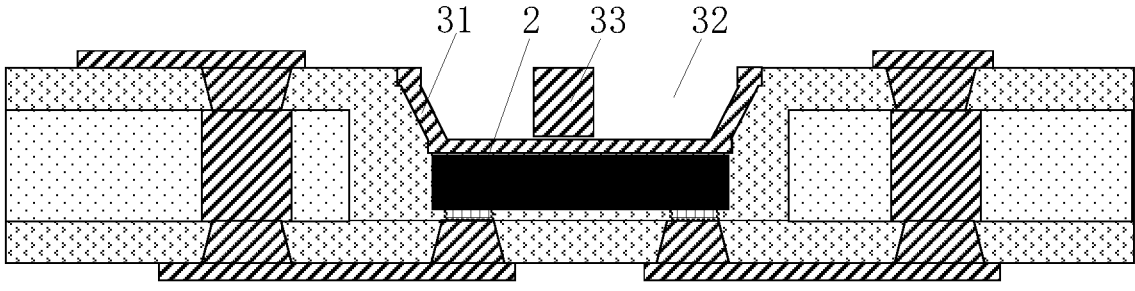
Figure 11:
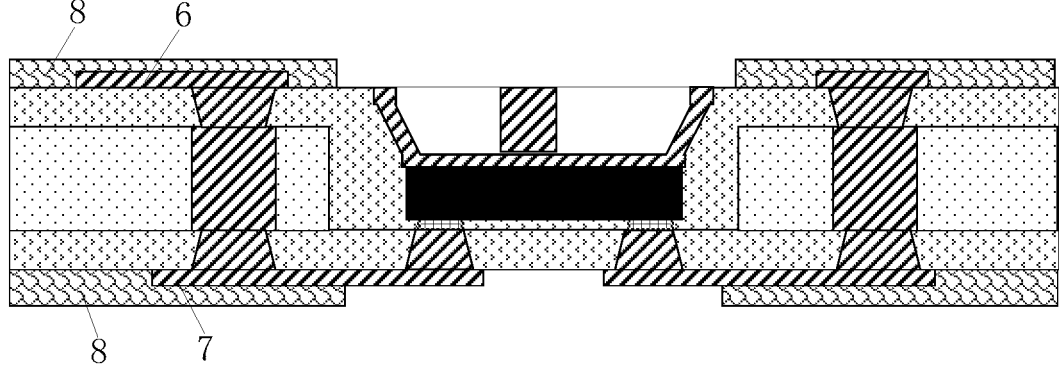
Figure 12:
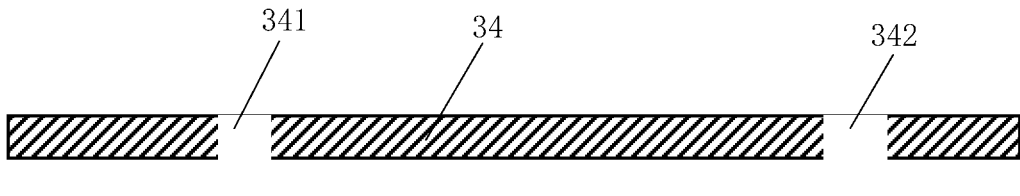

Step (e), referring to FIGS. 10, 11, and 12, form a support column 33 on the metal heat dissipation layer 31 on the heat dissipation face 22 of the device 2, and apply a cooling cover 34 on the support column 33, the cooling cover 34 closing the cooling chamber 32 along the periphery of the cooling chamber 32, wherein the cooling cover 34 is formed with a liquid inlet 341 and a liquid outlet 342.

The cooling cover 34 connects the support column 33 and the periphery of the metal heat dissipation layer 31 by solder or corrosion-resistant glue, thereby closing the cooling chamber 32. A liquid inlet 341 and a liquid outlet 342 are formed on the cooling cover 34, and the liquid inlet 341 and the liquid outlet 342 are provided on two sides of the support column 33. The liquid inlet 341 is used for connecting with an external liquid inlet system, and the liquid outlet 342 is used for connecting with an external liquid outlet system, so that the circulating cooling structure 3 can be connected with the external liquid inlet system and the external liquid outlet system. Therefore, the external cooling liquid can enter the circulating cooling structure 3 from the liquid inlet 341, and after passing through the cooling chamber 32, can finally flow out from the liquid outlet 342 of the circulating cooling structure 3. The cooling liquid can quickly take away the heat generated during the operation of the device 2, greatly improving the heat dissipation performance of the embedded packaging structure. In addition, the circulating cooling structure 3 is connected to the heat dissipation face 22 of the device 2, so that the heat dissipation performance can be improved, and the space in the substrate can be rationally used to reduce the overall thickness of the substrate.

Specifically, step (e) may include the following two specific implementation methods.

Implementation method 1: step (e) specifically includes the following steps:

step (e1) filling the cooling chamber 32 with a dielectric material to form a third dielectric layer: wherein, the dielectric material may be selected to be an FR4 material;

step (e2) forming an opening by laser in the third dielectric layer to form a third pattern exposing the metal heat dissipation layer 31: wherein, generally, the third dielectric layer is locally thinned by means of laser, drilling or plasma etching to form a third pattern exposing the metal heat dissipation layer 31: wherein, in a specific implementation, the third dielectric layer may be integrally thinned by plate grinding or plasma etching, and may be locally thinned by laser or drilling.

step (e3) electroplating filling the third pattern to form the support column 33; and step (e4) removing the third dielectric layer.

Implementation method 2: step (e) specifically includes the following steps:

step (e1') filling a photoresist material in the cooling chamber 32 to form a third photoresist layer: wherein, in this step, a photoresist material may be used as a filling material, serving the same function as a dielectric material;

step (e2'), exposing and developing the third photoresist layer to form a third pattern exposing the metal heat dissipation layer 31;

step (e3') electroplating to fill the third pattern to form the support column 33; and step (e4') removing the third photoresist layer.

Specific implementation modes of the above steps are referred to above and will not be described in detail herein.

In some embodiments, after step (e), the manufacturing method for a liquid circulating cooling package substrate further includes step (f): applying solder resist material on the first wiring layer 6 and the second wiring layer 7, respectively, to form a solder mask 8.

Specifically, the solder resist material can be applied by coating, film pasting, or printing, and exposing and developing are performed to form the solder mask 8. The exposed metal may also be surface treated by immersion gold, immersion silver, gold plating, or tin plating.

In summary, the present application provides a manufacturing method for a liquid circulating cooling package substrate, wherein a circulating cooling structure 3 is provided in the first dielectric layer, and the circulating cooling structure 3 is formed during the processing of the embedded package substrate, with a simple processing flow and low cost. The circulating cooling structure 3 can be connected with an external liquid inlet system and an external liquid outlet system. Therefore, the external cooling liquid can enter the circulating cooling structure 3 from the liquid inlet 341, and after passing through the cooling chamber 32, can finally flow out from the liquid outlet 342 of the circulating cooling structure 3. The cooling liquid can quickly take away the heat generated during the operation of the device 2, greatly improving the heat dissipation performance of the embedded packaging structure. In addition, the circulating cooling structure 3 is connected to the heat dissipation face 22 of the device 2, so that the heat dissipation performance can be improved, and the space in the substrate can be rationally used to reduce the overall thickness of the substrate. At the same time, the metal heat dissipation layer 31 itself can assist in heat dissipation, and in addition to the conduction heat dissipation of the circulating cooling liquid, the cooling liquid can quickly take away the heat generated during the operation of the device 2, greatly improving the heat dissipation performance of the embedded package substrate.

It is worth noting that in the description of the embodiments of the present invention, the continuous numbering of method steps is provided for the convenience of examination and understanding, and in conjunction with the overall technical solution of the present invention and the logical relationship between the various steps, the adjustment of the implementation order between the steps does not affect the technical effect achieved by the technical solution of the present invention. Some fabrication steps involved in the present embodiment, such as the steps of seed layer processing, pattern transfer, and pattern electroplating, are not described in detail herein, because the materials and processing flows in these steps are common knowledge in the art. To be precise, when designing the corresponding steps for a particular product, those skilled in the art can make appropriate choices from various alternative materials and manufacturing processes based on a clear understanding of parameters such as production batch size, substrate complexity, and the resolution of components and parts.

It needs to be noted that some embodiments of the present disclosure have been described above. Other embodiments are within the scope of the appended claims. In some cases, the acts or steps recorded in the claims may be executed in an order other than those of the embodiments described above and may still achieve the desired result. Additionally, the processes depicted in the figures do not necessarily require a particular order or sequential order as shown to achieve a desired result. Multi-tasking processing and parallel processing are also possible or may be advantageous in some implementation modes.

Those of ordinary skill in the art should understand that the discussion of any embodiment above is merely exemplary and is not intended to imply that the scope of the disclosure (including the claims) is limited to these examples: combinations of technical features in the above embodiments, or between different embodiments, may also be made under the concept of the present disclosure: the steps may be implemented in any order, and there may be many other variations of the different aspects of the embodiments of the present disclosure as described above, which are not provided in detail for concision.

The embodiments of the present disclosure are intended to cover all such substitutions, modifications, and variations that fall within the broad scope of the appended claims. Therefore, any omission, modification, equivalent replacement, improvement, etc. made within the spirit and principles of the embodiments of the present disclosure should be included in the scope of protection of the present disclosure.

What is claimed is:

1. A manufacturing method for a liquid circulating cooling package substrate, comprising:

(a) prefabricating a support frame, the support frame comprising a conducting column penetrating through the support frame in a height direction and at least one through cavity surrounded by the support frame;

(b) mounting a device having an active face and a heat dissipation face in the through cavity, and applying a first dielectric layer on a first surface of the support frame such that the first dielectric layer completely fills a gap between the device and the support frame;

(c) opening a hole in the first dielectric layer to form a first pattern, the first pattern comprising a cooling chamber exposing the heat dissipation face of the device, and filling the first pattern to form a first wiring layer and a metal heat dissipation layer on the heat dissipation face, wherein the metal heat dissipation layer completely covers the heat dissipation face and an inner side surface of the cooling chamber;

(d) applying a second dielectric layer to a second surface of the support frame, opening a hole in the second dielectric layer to form a second pattern, the second pattern exposing a terminal on the active face of the device, and filling the second pattern to form a second wiring layer, wherein the first wiring layer and the second wiring layer are electrically connected via the conducting column; and (e) forming a support column on the metal heat dissipation layer on the heat dissipation face of the device, and applying a cooling cover on the support column, the cooling cover closing the cooling chamber along a periphery of the cooling chamber, wherein the cooling cover is formed with a liquid inlet and a liquid outlet, wherein the step (e) further comprises:

(e1) filling the cooling chamber with a dielectric material to form a third dielectric layer;

(e2) forming an opening by laser in the third dielectric layer to form a third pattern exposing the metal heat dissipation layer;

(e3) electroplating to fill the third pattern to form the support column; and (e4) removing the third dielectric layer.

2. The manufacturing method according to claim 1, wherein step (b) comprises:

(b1) applying a temporary carrier on the second surface of the support frame;

(b2) placing the device in the through cavity such that the active face of the device is attached to the temporary carrier;

(b3) forming the first dielectric layer on the first surface of the support frame; and (b4) removing the temporary carrier.

3. The manufacturing method according to claim 2, wherein step (c) comprises:

(c1) forming a first metal seed layer on the first dielectric layer;

(c2) applying a first photoresist layer on the first metal seed layer, and exposing and developing the first photoresist layer to form the first pattern;

(c3) performing electroplating in the first pattern to form the first wiring layer and the metal heat dissipation layer on the heat dissipation face; and (c4) removing the first photoresist layer and the first metal seed layer.

4. The manufacturing method according to claim 1, wherein in step (c), the metal heat dissipation layer comprises a copper layer.

5. The manufacturing method according to claim 1, wherein step (d) comprises:

(d1) forming a second metal seed layer on the second dielectric layer;

(d2) applying a second photoresist layer on the second metal seed layer, and exposing and developing the second photoresist layer to form the second pattern;

(d3) performing electroplating in the second pattern to form the second wiring layer; and (d4) removing the second photoresist layer and the second metal seed layer.

6. The manufacturing method according to claim 1, wherein step (e) further comprises:

(e1') filling a photoresist material in the cooling chamber to form a third photoresist layer;

(e2') exposing and developing the third photoresist layer to form a third pattern exposing the metal heat dissipation layer;

(e3') electroplating to fill the third pattern to form the support column; and (e4') removing the third photoresist layer.

7. The manufacturing method according to claim 1, wherein in step (e), the cooling cover connects the support column and a periphery of the metal heat dissipation layer by solder or corrosion-resistant glue, thereby closing the cooling chamber.

8. The manufacturing method according to claim 1, further comprising:

(f) after step (e), applying a solder resist material on the first wiring layer and the second wiring layer, respectively, to form a solder mask.

* * * * *